United States Patent [19]
Koullias

[11] Patent Number: 5,396,192
[45] Date of Patent: Mar. 7, 1995

[54] RADIO FREQUENCY AMPLIFIER

[75] Inventor: Iconomos A. Koullias, West Lawn, Pa.

[73] Assignee: AT&T Corp., Murray Hill, N.J.

[21] Appl. No.: 175,023

[22] Filed: Dec. 29, 1993

[51] Int. Cl.$^6$ ............................................. H03G 3/30
[52] U.S. Cl. ..................................... 330/254; 330/284
[58] Field of Search ...................... 307/493, 494, 529; 330/254, 278, 284; 455/249.1

[56] References Cited

U.S. PATENT DOCUMENTS 4,641,368  2/1987  Sullivan ........................... 330/284 X
4,704,738  11/1987 Graziadei et al. ............... 330/254 X

OTHER PUBLICATIONS

IBM Technical Disclosure Bulletin vol. 32, No. 7, Dec. 1989 pp. 317–319.

*Primary Examiner*—Steven Mottola

[57] ABSTRACT

An amplification arrangement comprises an electrical circuit that includes a voltage divider having a plurality of resistors connected in series between a signal output and a reference potential source, and a plurality of parallel branches each extending between a common main input and a different one of a plurality of voltage divider nodes situated between the resistors. A multiplier is interposed in each of the branches and has a multiplication factor that is connected through a switching device with an electrical signal source. The switching device routes the electrical signals from the source to the different multipliers in dependence on the magnitude of a gain control signal supplied to its control input and indicative of the area of the gain range in which the arrangement is to operate at that time to obtain the desired signal amplification.

6 Claims, 2 Drawing Sheets

RADIO FREQUENCY AMPLIFIER

BACKGROUND OF THE INVENTION

1. Field of the Invention

The present invention relates to amplifying arrangements in general, and more particularly to radio frequency amplifying arrangements operative over a relatively wide gain range.

2. Description of the Related Art

There are already known various arrangements for amplifying electrical signals, including arrangements that have been designed for use or are particularly suited to be used for amplifying alternating current signals at frequencies as high as in the radio frequency (RF) range. While such previously known amplifying arrangements have been found to satisfy most if not all performance criteria put on them, a perennially problematical area has been the gain range within which an amplifying arrangement of a reasonably simple and commensurately inexpensive construction is able to accomplish the required level of amplification without incurring unacceptable signal distortion.

With the increasing demand for services involving the utilization of the broadcast spectrum, which demand has become even more pronounced since the advent of such relatively recent telecommunications service offerings as radio paging, cellular telephony and other voice and/or data broadcasting techniques, it has become apparent that approaches that may have worked to satisfaction in the past are no longer suitable for such uses. This is so, if for no other reason, then because the equipment used by the ultimate user or subscriber, besides operating at relatively low transmitted signal power levels, is often being used in a mobile manner, that is, the subscriber transmitter and/or receiver equipment accompanies the subscriber as he or she travels from place to place, frequently while the equipment is being used. This, in turn, means that the power of the transmitted signal as received at any particular receiving location or station varies within a relatively wide range and often quite abruptly, be it because the respective subscriber transmitter or receiver has moved behind, or emerged from behind, a signal attenuating obstruction, because of changing distance between the transmitter and receiver, as a result of changing atmospheric or other relevant environmental conditions. or for other similar reasons.

SUMMARY OF THE INVENTION

Accordingly, it is a general object of the present invention to avoid the disadvantages of the prior art.

More particularly, it is an object of the present invention to develop an amplification arrangement that is capable of amplifying electrical signals, especially alternating current signals with frequencies as high as in the radio frequency range, over a very wide gain range.

Still another object of the present invention is to construct the amplifying arrangement of the type here under consideration in such a manner as to achieve easy selection of the area of the gain range in which the arrangement is to operate at any particular time.

It is yet another object of the invention to provide an arrangement of the above type that operates with only a minimum amount of distortion, if any, in any selected area of the wide gain range.

A concomitant object of the invention is to devise an amplifying arrangement of the above type that is relatively simple in construction, inexpensive to manufacture, easy to operate at relatively low power consumption, and reliable in operation nevertheless.

In keeping with these objects and others that will become apparent hereafter, one feature of the present invention resides in an amplification arrangement which comprises an electrical circuit having a signal input for receiving an input signal to be amplified and a signal output for issuing an amplified version of said input signal. This electrical circuit includes a voltage divider including a plurality of resistors connected in series through intervening nodes between the signal output and a reference potential source, and a plurality of parallel branches each having an input end connected to the signal input and an output end connected to a different one of the nodes of the voltage divider. According to the invention, each of the branches has interposed in it a multiplier that has a multiplication factor input. Supply means is further provided for supplying electric signals originating in an electric current source to the multiplication factor inputs. Routing means is interposed in the supplying means between the electric current source and the multiplication factor inputs and is operative for routing the electric signals from the electric current source to the multiplication factor inputs of the multipliers. The routing means is responsive to a gain control signal indicative of the strength of the input signal to selectively activate tile multipliers by routing the electric signals to a selected one of the multiplication inputs.

The amplifying arrangement as described so far is advantageous in that it makes it possible to change the area of the overall gain range covered by the arrangement in dependence on the magnitude of a gain control signal, by merely routing the electrical signal (electric current) from the electric current source to the appropriate one of the multipliers, thus activating the same for operation in the associated gain range area. This means that relatively weak incoming (RF) signals can be amplified more than relatively strong ones, by merely going from one of the gain areas to another, and yet the amplification will be without substantial distortion because the circuitry operates within its region of substantially linear response in each of the gain range areas. Of course, the degree of amplification at any particular time depends on where the amplification is then accomplished, that is on which of the branches is involved in such amplification at such time. This is so because the resistance of the resistors situated between the node to which the output end of that particular branch is connected and the source of reference voltage (i.e. ground) determines the voltage excursion at such node and hence the voltage level to which the alternating (RF) signal is amplified. Moreover, inasmuch as the selection of the gain range area in which the circuitry is to operate at any particular time is accomplished by the routing means under the control of the controlling means, such selection can be achieved rapidly and frequently to adapt operation of the amplifying arrangement to changing reception conditions with only minimum reaction delay time.

According to an advantageous feature of the present invention, the routing means includes switching means that has a main input connected to the electric current source, a plurality of outputs each connected to the multiplication factor input of a different one of the multipliers and a control input, means for selectively connecting the main input with the outputs of the switching means, and means for transferring the connecting means among the outputs in dependence on the magnitude of an automatic gain control signal applied to the control input.

It is further advantageous to the present invention when the switching means is equipped with a multiplicity of reference inputs, when there is further provided means for applying a different electric reference potential to each of the reference inputs, and when the connecting means includes a plurality of switching transistors each having a base connected to a different one of the reference inputs and control input to control the amount of electric current flowing through the respective transistor on the basis of the magnitude of the automatic gain control signal with respect to the reference signals. Such transistors are advantageously arranged in cascaded relationship in at least two tiers of different order, with the transistors of each tier being advantageously arranged in parallel to one another, while those of one of the tiers are arranged in series with those of the respective other of the tiers.

A particularly simple and otherwise advantageous construction of the amplifying arrangement according to the present invention is obtained when the switching means is so constructed that its connecting means is operative for connecting the input of the switching means with only one of its outputs at a time.

The novel features which are considered as characteristic of the invention are set forth in particular in the appended claims. The improved amplifying arrangement itself, however, both as to its construction and its operation, together with additional features and advantages thereof, will be best understood upon perusal of the following detailed description of certain specific embodiments with reference to the accompanying drawing.

DETAILED DESCRIPTION OF THE PREFERRED EMBODIMENTS

Figure 1:
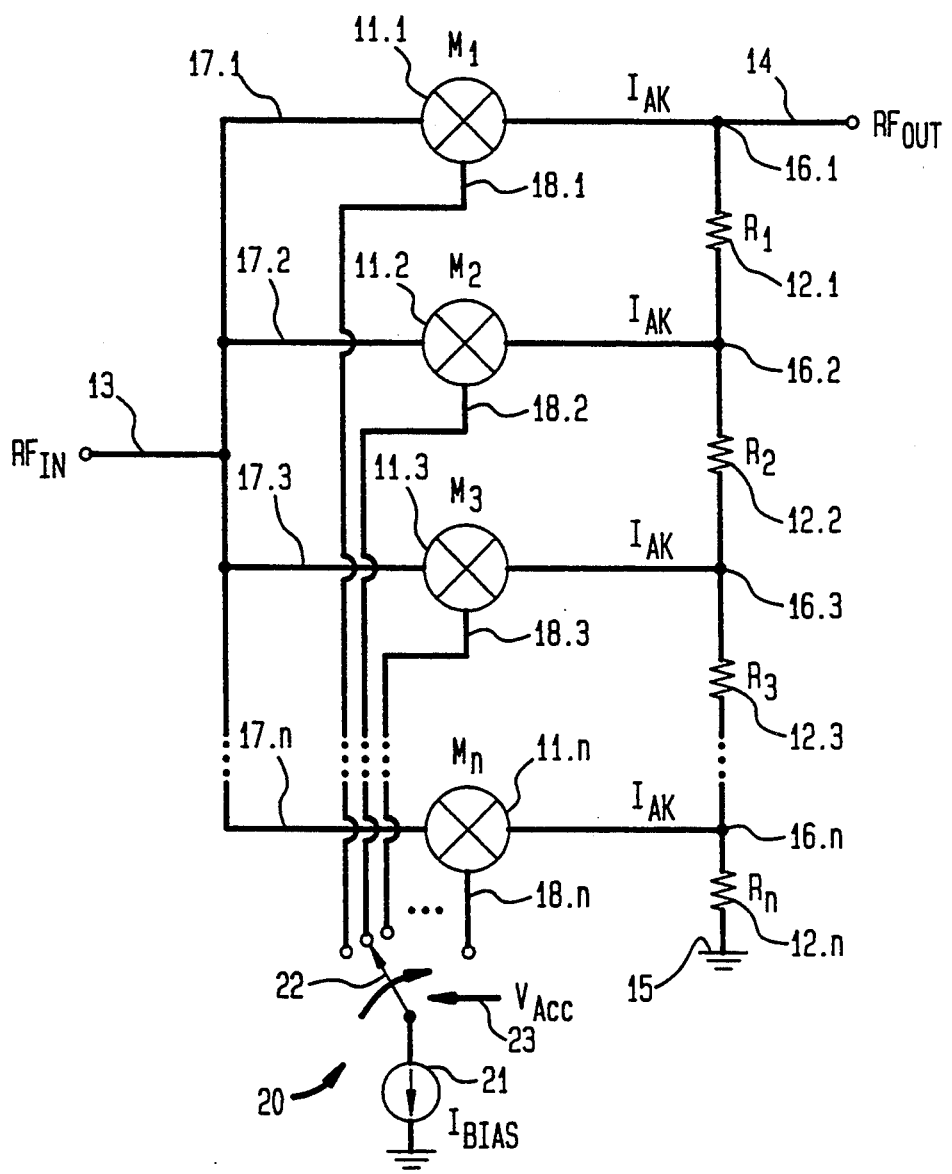
FIG. 1 is a diagrammatic view of amplifier circuitry embodying the principles of the present invention.

Referring now to the drawing in detail, and first to FIG. 1 thereof, it may be seen that the reference numeral 10 has been used therein to identify a radio frequency (RF) amplifier circuitry embodying the present invention. The amplifier circuitry 10 includes, as some of its important components, a plurality of multipliers 11.1 to 11.n, and a plurality of resistors 12.1 to 12.n. The circuitry 10 has an input 13 for receiving an incoming signal (indicated to be at an RF frequency) and an output 14 for issuing an amplified signal (once more indicated to be in the RF range).

The aforementioned resistors 12.1 to 12.n are interposed, in a series relationship, between the output 14 and a source 15 of reference potential, i.e. the ground. Reference numerals 16.1 to 16.n have been used to indicate various nodes or junction points present between the output 14 and the individual resistors 12.1 to 12.n. The multipliers 11.1 to 11.n are interposed in separate parallel branches 17.1 to 17.n all of which have their respective input ends connected in common to the input 13, and each of which has its output end individually connected to a different one of the nodes 16.1 to 16.n.

Each of the multipliers 11.1 to 11.n further has a multiplication factor input 18.1 to 18.n that serves to receive an electrical signal that controls the operation of the respective multiplier 11.1 to 11.n in that it causes the activation of the respective affected one of the multipliers 11.1 to 11.n and its performance, especially the multiplication factor by which the respective multiplier 11.1 to 11.n multiplies the $RF_{in}$ input signal to obtain a multiplied or amplified output signal. Advantageously, the multipliers 11.1 to 11.n have the same performance characteristics, so that they utilize the same multiplication factor when fully activated.

The activation of the respective multipliers 11.1 to 11.n is the result of operation of a routing device 20 that is interposed between the multiplication factor inputs 18.1 to 18.n of the multipliers 11.1 to 11.n and an electric current source 21 that supplies an electric current $I_{bias}$ that constitutes the aforementioned electrical control signal for activating the respective multipliers 11.1 to 11.n. The routing device 20 is illustrated in FIG. 1 of the drawing as being constructed as a multiway switch having a selector arm 22 that can be indexed between a plurality of positions connecting the electric current source 21 with one (and only one) of the multiplication factor inputs 18.1 to 18.n. Under these circumstance, only the chosen one of the multipliers 11.1 to 11.n is activated at any given time, while the remaining ones are in their maximum attenuation states.

This means that an output current is furnished, for all intents and purposes, only at the output of the then active one of the multipliers 11. to 11.n and flows to the respective associated one of the nodes 16.1 to 16.n and from there to the output 14 to constitute the final amplified output signal $RF_{output}$. It will be appreciated that the concatenation of series arrangement of the resistors 12.1 to 12.n constitutes, in effect, a voltage divider in that the output signal $I_{AK}$ Of each of the multipliers 11.1 "sees" a different number (and hence different total resistance) of the resistors 12.1 to 12.n between itself and the ground (reference) potential is. As is well known, for the same value of IAK, the aforementioned, 1 total resistance determines the voltage encountered on the associated one of the nodes 16.1 to 16.n and thus the amplification (gain) imposed by the circuitry 10 under such circumstances.

The indexing of the selector arm 22 occurs, as indicated at 23, under the control of an automatic gain control signal $V_{AGC}$ that is generated in any well known manner that need not be discussed here. Suffice it to say that the AGC signal has a value indicative of the strength of the incoming or received RF signal and that this value is being used, in any well known manner, to index the arm 22 into the desired position in which the circuitry 10 boosts the $RF_{in}$ signal to the extent needed before issuing the amplified replica as the output signal $RF_{out}$.

Figure 2:
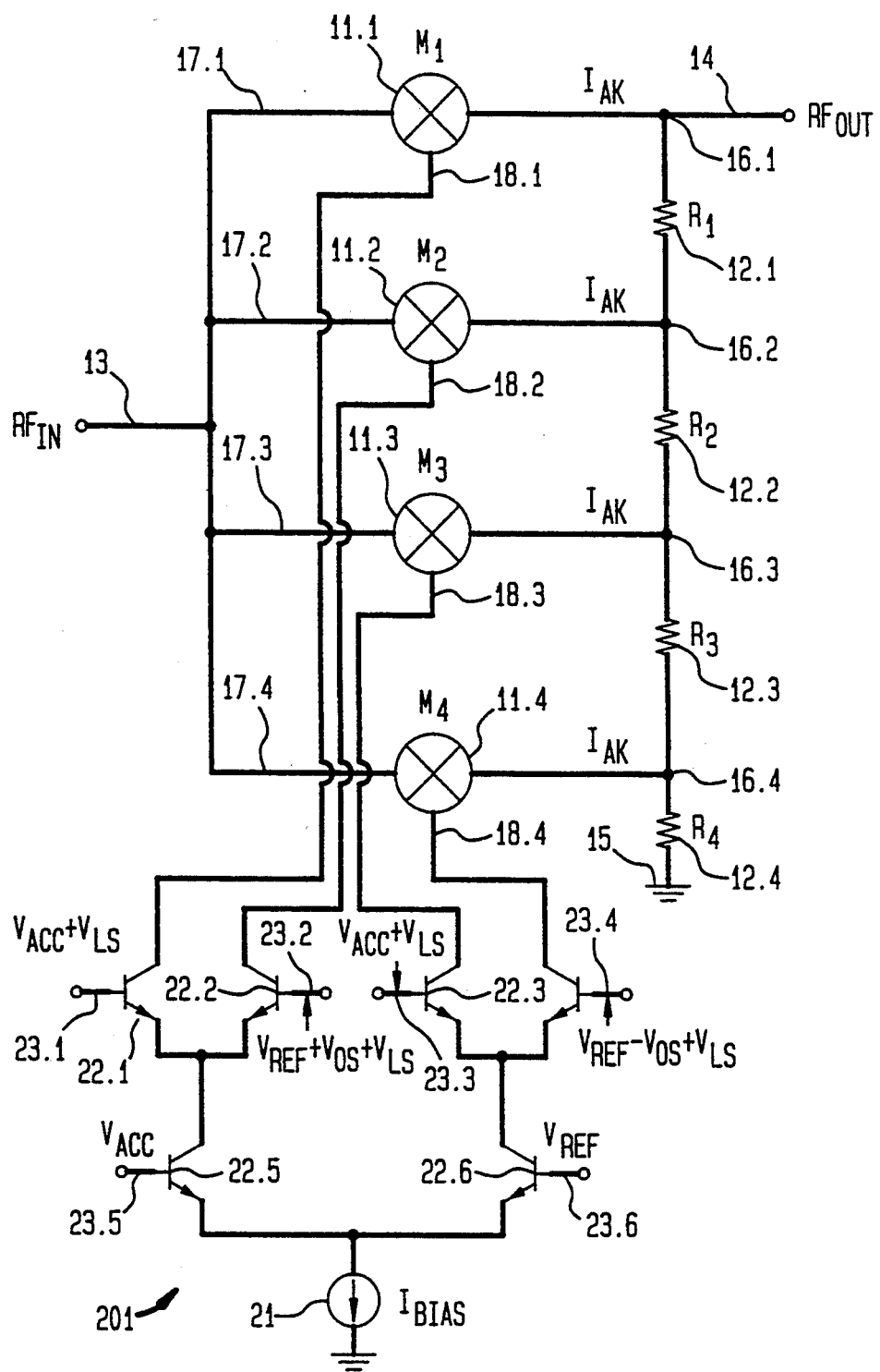
FIG. 2 is a view similar to that of FIG. 1 but showing an implementation of such principles in a modified amplifier circuitry.

A somewhat modified version of the circuitry 10, which constitutes a currently preferred implementation of the principles discussed above in conjunction with FIG. 1, is depicted in FIG. 2. This version is similar to that described above in so many respects that the same reference numerals as before have been used in FIG. 2 to identify identical parts or features, and similar numbers, but supplemented with a prime and/or numerical suffixes, have been used to denote functional equivalents. The structure and operation of circuitry 10' as such need not be discussed because they are the same as before, except to say that it has been shown to have only four branches 17.1 to 17n and associated hardware. Rather, attention is to be directed specifically to the routing device 20'.

In the routing device 20' of FIG. 2, the function of the selector arm 22 is performed by four transistors 22.1 to 22.4 arranged in one tier, and two transistors 22.5 and 22.6 arranged in another tier. On the other hand, correspondingly denoted and tiered control inputs 23.1 to 23.6 sere a similar, albeit not necessarily identical, purpose as the control input 23 of FIG. 1. It may be seen that the $V_{AGC}$ control signal is supplied to the input 23.5 of the "lower" tier, as well as to the inputs 23.1 and 23.3 of the "upper" tier, while a reference (comparison) signal $V_{REF}$ Signal is applied to the lower tier input 23.6 and to the upper tier inputs 23.2 and 23.4. The voltage values of all of the signals applied to the inputs 23.1 to 23.4 are raised by $V_{LS}$ of such a value as to compensate for the voltage drop occurring in the lower tier. Moreover, the voltages supplied to the inputs 23.2 and 23.4 are offset (up and down, respectively) with respect to that supplied to the inputs 23.1 and 23.3 by an offset voltage $V_{os}$.

In operation, the transistors forming respective transistor pairs 22.1 and 22.2, 22.3 and 22.4, and 22.5 and 22.6, in effect, compare the voltages applied to their respective inputs 23.1 to 23.6 and determine the flow of electric control current $I_{bias}$. The operation of the routing device 20' of FIG. 2 allows for a much smoother operation because the transitions between the various multipliers 11.1 to 11.4 are not as abrupt as in the situation shown in FIG. 1 and, in fact, could even be made to all but disappear by proper operating parameter selection and thereby to achieve continuously variable control.

While the invention has been illustrated and described as embodied in several implementations of an automatic gain arrangement for RF signals, it is not intended to be limited to the details shown, since various modifications and structural changes may be made without departing in any way from the spirit of the present invention.

Without further analysis, the foregoing will so fully reveal the present invention that others can, by applying current knowledge, readily adapt it for various applications without omitting features that, from the standpoint of prior art, fairly constitute essential characteristics of the generic and specific aspects of the contribution to the art and, therefore, such adaptations should and are intended to be comprehended within the meaning and range of equivalence of the claims.

What is claimed as new and desired to be protected by Letters Patent is set forth in the appended claims.

I claim:

1. An amplification arrangement, comprising:
   an electrical reference potential source;
   an electrical circuit having a main signal input for receiving an input signal having a strength to be amplified and a signal output for issuing an amplified version of said input signal, and including
   a voltage divider comprising a plurality of resistors connected in series through intervening nodes between said signal output and said reference potential source, and
   a plurality of parallel branches each having an input end connected to said main signal input and an output end, said output end of each of said branches being connected to a different one of said nodes of said voltage divider;
   a plurality of multipliers each interposed in a different one of said branches and each having a multiplication factor input;
   supplying means including an electric current source for supplying electric signals to said multiplication factor inputs; and
   routing means interposed in said supplying means between said electric current source and said multiplication factor inputs for routing said electric signals from said electric current source to said multiplication factor inputs of said multipliers, said routing means being responsive to the strength of the input signal to selectively activate said multipliers in accordance with the input signal strength by routing said electric signals to a selected one of said multiplication inputs.

2. The arrangement as defined in claim 1, wherein said routing means includes switching means having a main input connected to said electric current source, a plurality of outputs each connected to a multiplication factor input of a different one of said multipliers and a control input, connecting means for selectively connecting said main input with said outputs of said switching means, and means for transferring said connecting means among said outputs in dependence on the magnitude of an automatic gain control signal applied to said control input.

3. The arrangement as defined in claim 2, wherein said switching means further includes a multiplicity of reference inputs; further comprising means for applying a different electric reference potential to each of said reference inputs; and wherein said connecting means includes a plurality of switching transistors each having a base connected to a different one of said reference inputs and said control input to control the amount of electric current flowing through the respective transistor on the basis of the magnitude of said automatic gain control signal with respect to said reference signals.

4. The arrangement as defined in claim 3, wherein said transistors are arranged in cascaded relationship in at least two tiers of different order.

5. The arrangement as defined in claim 4, wherein said transistors of each of said tiers are arranged in parallel to one another, and those of one of said tiers are arranged in series with those of the respective other of said tiers.

6. The arrangement as defined in claim 3, wherein said connecting means is operative for connecting said input of said switching means with only one of said outputs thereof at a time.

* * * * *